United States Patent
Isoda et al.

(10) Patent No.: US 12,125,510 B2
(45) Date of Patent: Oct. 22, 2024

(54) MAGNETORESISTANCE MEMORY DEVICE

(71) Applicants: Kioxia Corporation, Tokyo (JP); SK hynix Inc., Icheon-si (KR)

(72) Inventors: Taiga Isoda, Seoul (KR); Young Min Eeh, Seongnam-si (KR); Tadaaki Oikawa, Seoul (KR); Eiji Kitagawa, Seoul (KR); Kazuya Sawada, Seoul (KR); Jin Won Jung, Icheon-si (KR); Jung Hyeok Kwak, Icheon-si (KR)

(73) Assignees: Kioxia Corporation, Tokyo (JP); SK HYNIX INC., Gyeonggi-Do (KR)

( * ) Notice: Subject to any disclaimer, the term of this patent is extended or adjusted under 35 U.S.C. 154(b) by 581 days.

(21) Appl. No.: 17/389,399

(22) Filed: Jul. 30, 2021

(65) Prior Publication Data
US 2022/0199136 A1  Jun. 23, 2022

(30) Foreign Application Priority Data
Dec. 17, 2020  (JP) .................................. 2020-209269

(51) Int. Cl.
*G11C 11/16* (2006.01)
*H10B 61/00* (2023.01)
(Continued)

(52) U.S. Cl.
CPC ............. *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC .......... G11C 2211/5615; G11C 11/161; G11C 11/22–2297; G11C 11/5657; G11C 14/0027; G11C 14/0072; G11C 11/1659; G11C 11/1675; G11C 13/003; H10N 50/10; H10N 50/80; H10N 50/85; G01R 33/098; G11B 5/3909; H10B 51/00–50;
(Continued)

(56) References Cited

U.S. PATENT DOCUMENTS 8,705,269 B2  4/2014  Nagase et al.
8,897,060 B2  11/2014  Nakayama et al.
(Continued)

FOREIGN PATENT DOCUMENTS

JP  3583091 B2  8/2004
JP  5093910 B2  9/2012
(Continued)

OTHER PUBLICATIONS

Barmak et al, J. Appl. Phys. 98, 033904 (2005), DOI: 10.1063/1.1991968 (Year: 2005).*
(Continued)

*Primary Examiner* — Cuong B Nguyen
(74) *Attorney, Agent, or Firm* — Holtz, Holtz & Volek PC

(57) ABSTRACT

In general, according to one embodiment, a magnetoresistance memory device includes: a first ferromagnetic layer; an insulating layer above the first ferromagnetic layer; a second ferromagnetic layer above the insulating layer; a third ferromagnetic layer above the second ferromagnetic layer; and a fourth ferromagnetic layer above the third ferromagnetic layer. The third ferromagnetic layer includes an oxide of an alloy including iron. The fourth ferromagnetic layer includes iron and a 5d transition metal.

20 Claims, 8 Drawing Sheets

(51) Int. Cl.
  *H10N 50/10* (2023.01)
  *H10N 50/80* (2023.01)
  *H10N 50/85* (2023.01)

(58) Field of Classification Search
  CPC .. H10B 53/00–50; H10B 61/00; H10B 61/10; H10B 61/22; H01L 2924/1441; H01L 21/28291; H01L 29/516; H01L 29/6684; H01L 29/78391; H01L 28/40–92
  See application file for complete search history.

(56) References Cited

U.S. PATENT DOCUMENTS

| | | |
|---|---|---|
| 9,461,240 B2 | 10/2016 | Sawada et al. |
| 10,211,256 B2 | 2/2019 | Kitagawa |
| 10,388,343 B2 | 8/2019 | Oikawa et al. |
| 10,468,170 B2 | 11/2019 | Eeh et al. |
| 10,840,434 B2 | 11/2020 | Kitagawa et al. |
| 10,873,021 B2 | 12/2020 | Eeh et al. |
| 2004/0008453 A1 | 1/2004 | Nie |
| 2005/0111147 A1 | 5/2005 | Hiramoto et al. |
| 2009/0256220 A1 | 10/2009 | Horng et al. |
| 2017/0229642 A1* | 8/2017 | Hu ................. H10N 50/10 |
| 2020/0082857 A1 | 3/2020 | Eeh et al. |
| 2020/0294567 A1 | 9/2020 | Oikawa et al. |
| 2021/0074908 A1 | 3/2021 | Oikawa et al. |
| 2021/0074911 A1 | 3/2021 | Isoda et al. |
| 2021/0083170 A1 | 3/2021 | Sawada et al. |
| 2021/0287728 A1 | 9/2021 | Isoda et al. |
| 2021/0351344 A1* | 11/2021 | Tseng .................. H10B 61/00 |

FOREIGN PATENT DOCUMENTS

| | | |
|---|---|---|
| JP | 2021144967 A | 9/2021 |
| WO | 2011036795 A1 | 3/2011 |

OTHER PUBLICATIONS

U.S. Appl. No. 17/016,230, First Named Inventor: Kazuya Sawada; Title: "Magnetic Memory Device"; filed Sep. 9, 2020.

U.S. Appl. No. 17/016,256, First Named Inventor: Taiga Isoda; Title: "Memory Device"; filed Sep. 9, 2020.

* cited by examiner

MAGNETORESISTANCE MEMORY DEVICE

CROSS-REFERENCE TO RELATED APPLICATIONS

This application is based upon and claims the benefit of priority from Japanese Patent Application No. 2020-209269, filed Dec. 17, 2020, the entire contents of which are incorporated herein by reference.

FIELD

Embodiments described herein relate generally to a magnetoresistance memory device.

BACKGROUND

A magnetoresistance memory device is known as a type of memory device. A magnetoresistance memory device stores data using an element exhibiting a magnetoresistance effect. The magnetoresistance memory device is required to be able to stably store data.

DETAILED DESCRIPTION

Figure 1:
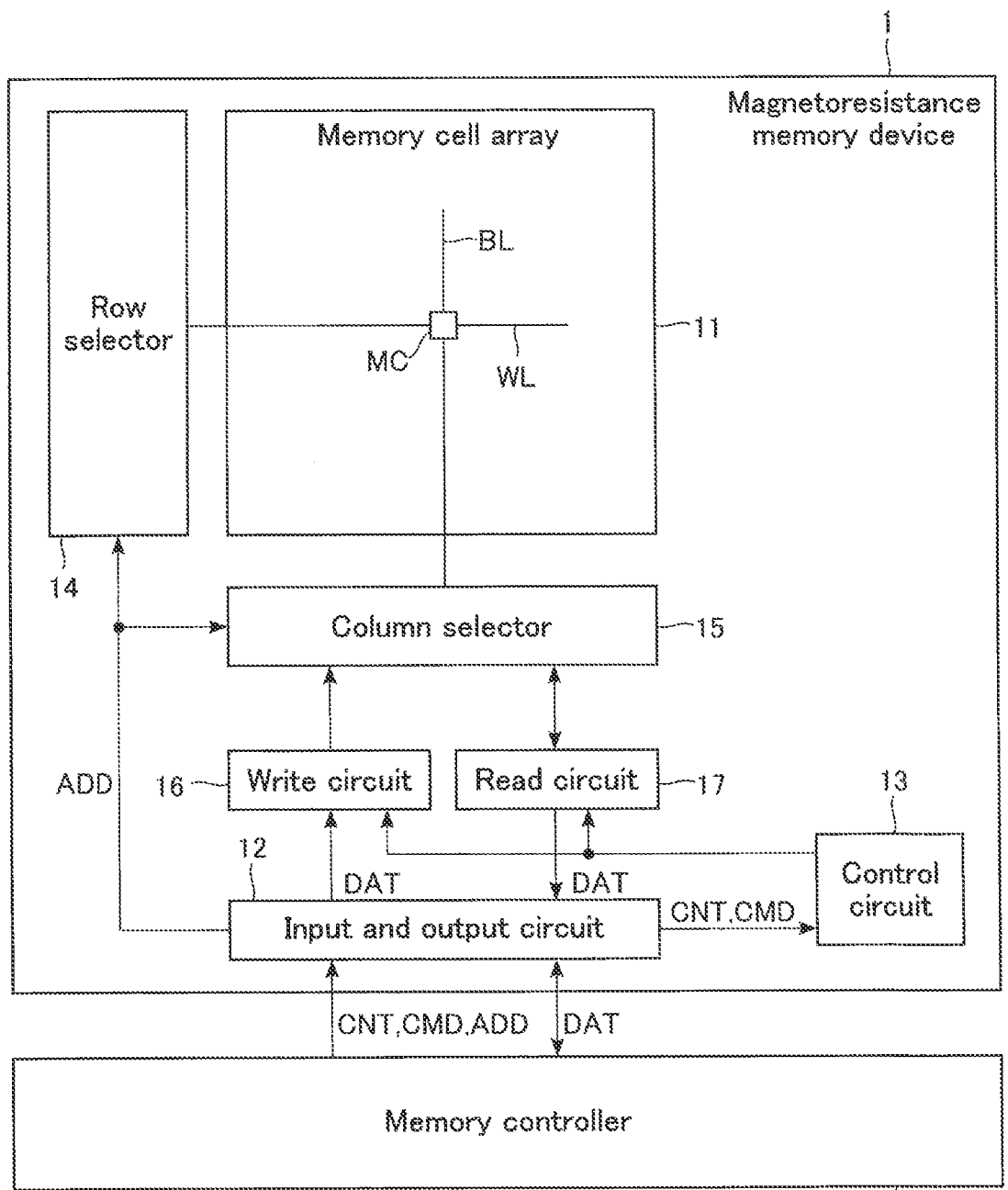
FIG. 1 shows functional blocks and relevant components of a magnetoresistance memory device of a first embodiment.

In general, according to one embodiment, a magnetoresistance memory device includes: a first ferromagnetic layer; an insulating layer above the first ferromagnetic layer; a second ferromagnetic layer above the insulating layer; a third ferromagnetic layer above the second ferromagnetic layer; and a fourth ferromagnetic layer above the third ferromagnetic layer. The third ferromagnetic layer includes an oxide of an alloy including iron. The fourth ferromagnetic layer includes iron and a 5d transition metal.

Embodiments will now be described with reference to the figures. In the following description, in order to distinguish components having substantially the same function and configuration from each other, an additional numeral or letter may be added to the end of each reference numeral.

The figures are schematic, and the relation between the thickness and the area of a plane of a layer and the ratio of thicknesses of layers may differ from the actual ones. The figures may include components which differ in relations and/or ratios of dimensions in different figures.

In the specification and the claims, a phrase of a particular first component being "coupled" to another second component includes the first component being coupled to the second component either directly or via one or more components which are always or selectively conductive.

The embodiments will be described using an xyz orthogonal coordinate system.

1. First Embodiment

1.1. Structure (Configuration)
1.1.1. Overall Structure

FIG. 1 shows the functional blocks of a memory device according to a first embodiment. As shown in FIG. 1, the magnetoresistance memory device 1 is controlled by a memory controller 2. The magnetoresistance memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cells MC can store data in a non-volatile manner. Each memory cell MC is coupled to a single word line WL and a single bit line BL. Each word line WL is associated with a row. Each bit line BL is associated with a column. Selection of one row and selection of one or more columns specify one or more memory cells MC.

The input and output circuit 12 receives a control signal CNT, a command CMD, an address signal ADD, and data (write data) DAT from a memory controller 2. The input and output circuit 12 transmits data (read data) DAT to the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12 and brings bit lines BL associated with the column specified by the received address signal ADD into a selected state.

The control circuit 13 receives the control signal CNT and the command CMD from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selector 15 based on the control by the control circuit 13 and the write data DAT.

The read circuit 17 uses the voltages used for data reading based on the control of the control circuit 13, to determine data stored in the memory cells MC. The determined data is supplied to the input and output circuit 12 as the read data DAT. The read-out circuit 17 includes a sense amplifier.

1.1.2. Circuit Configuration of Memory Cell Array

Figure 2:
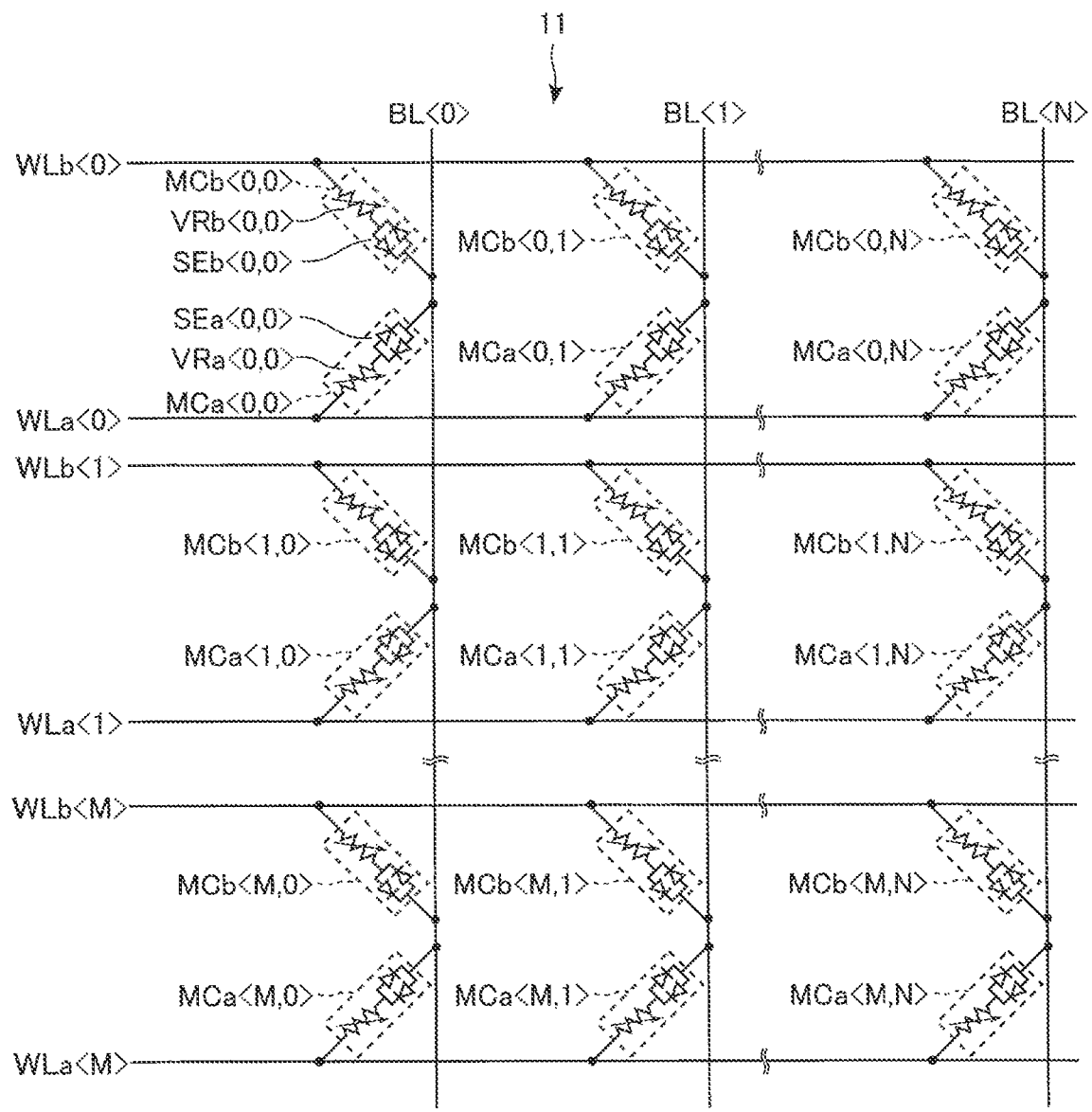
FIG. 2 is a circuit diagram of a memory cell array of the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, ..., and WLa<M>) and (M+1) word lines WLb (WLb<0>, WLb<1>, ..., and WLb<M>), where M is a natural number. The memory cell array 11 also includes (N+1) bit lines BL (BL<0>, BL<1>, . . . , and BL<N>), where N is a natural number.

Each memory cell MC (MCa and MCb) has a first node and a second node. Each memory cell MC is coupled, at its first end, to a single word line WL, and is coupled, at its second node, to a single bit line BL. More specifically, the memory cells MCa encompass memory cells MCa<$\alpha,\beta$> for all combinations of $\alpha$ and $\beta$, where a is every integer equal to or greater than 0 and equal to or less than M, and $\beta$ is every integer equal to or greater than 0 and equal to or less than N, and the memory cell MCa<$\alpha,\beta$> is coupled between the word line WLa<$\alpha$> and the bit line BL<$\beta$>. Similarly, the memory cells MCb encompass memory cells MCb<$\alpha,\beta$>, for all combinations of $\alpha$ and $\beta$, where a is every integer equal to or greater than 0 and equal to or less than M, and p is every integer equal to or greater than 0 and equal to or less than N, and the memory cell MCb<$\alpha,\beta$> is coupled between the word line WLb<$\alpha$> and the bit line BL<$\beta$>.

Each memory cell MC includes one magnetoresistance effect element VR (VRa or VRb) and one selector SE (SEa or SEb). More specifically, the memory cell MCa<$\alpha,\beta$> includes a magnetoresistance effect element VRa<$\alpha,\beta$> and a selector SEa<$\alpha,\beta$> for all combinations of $\alpha$ and $\beta$, where $\alpha$ is every integer equal to or greater than 0 and equal to or smaller than M, and $\beta$ is every integer equal to or greater than 0 and equal to or smaller than N. Moreover, each memory cell MCb<$\alpha,\beta$> includes a magnetoresistance effect element VRb<$\alpha,\beta$> and a selector SEb<$\alpha,\beta$> for all combinations of $\alpha$ and $\beta$, where $\alpha$ is every integer equal to or greater than 0 and equal to or smaller than M, and $\beta$ is every integer equal to or greater than 0 and equal to or smaller than N.

In each memory cell MC, the magnetoresistance effect element VR and the selector SE are coupled in series. The magnetoresistance effect element VR is coupled to one word line WL, and the selector SE is coupled to one bit line BL.

The magnetoresistance effect element VR can switch between a low-resistance state and a high-resistance state. The magnetoresistance effect element VR can store 1-bit data, using the difference in the two resistance states.

The selector SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to that of switching between the high-resistance state and the low-resistance state based on the magnitude of the voltage applied in the first direction, with respect to a second direction opposite to the first direction. In other words, the switching element is a bidirectional switching element. By turning the switching element on or off, it is possible to perform control as to whether or not to supply a current to a magnetoresistance effect element VR coupled to the switching element, namely, whether or not to select the magnetoresistance effect element VR.

1.1.3. Structure of Memory Cell Array

Figure 3:
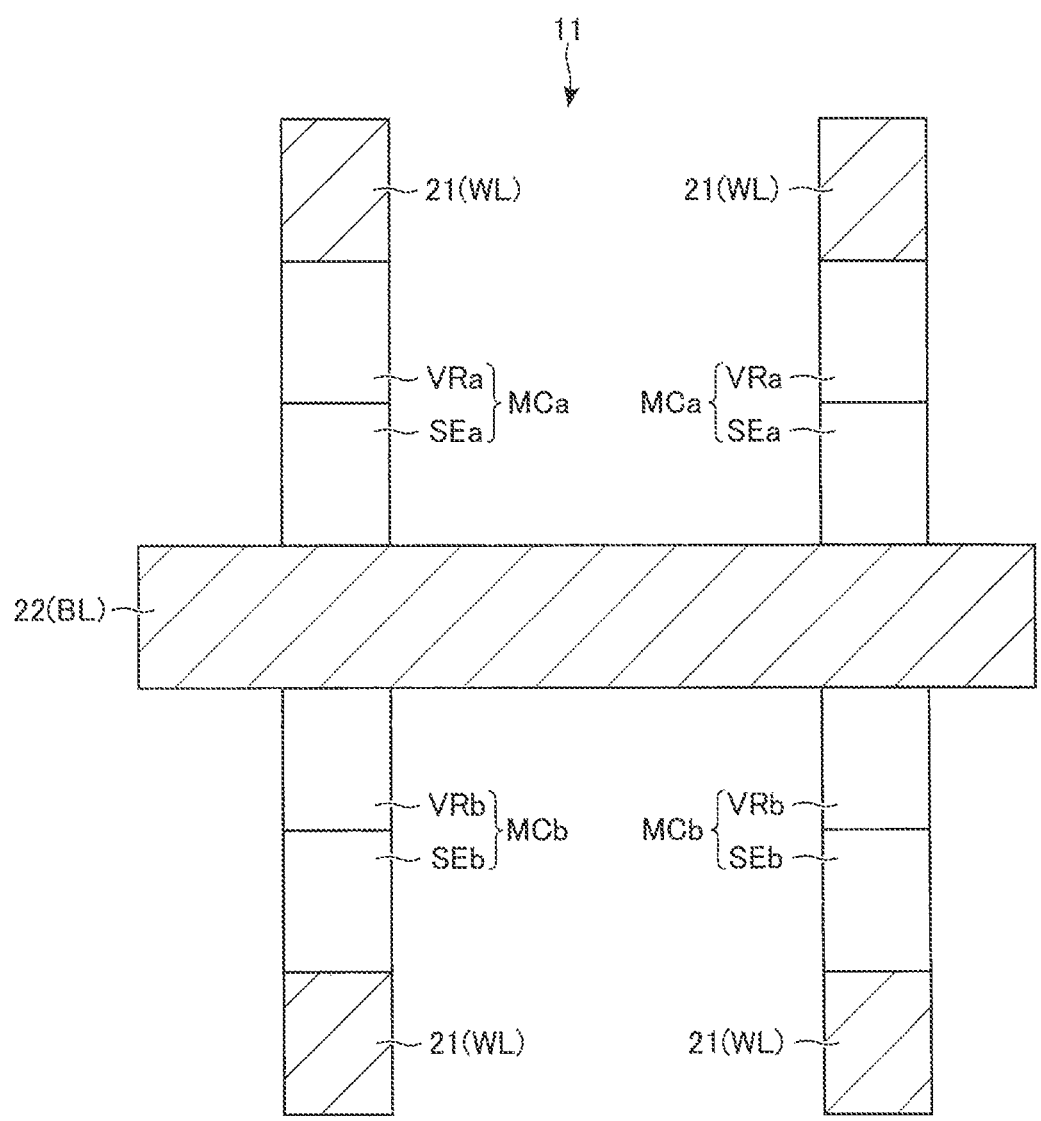
FIG. 3 shows a cross-sectional structure of part of the memory cell array of the first embodiment.
Figure 4:
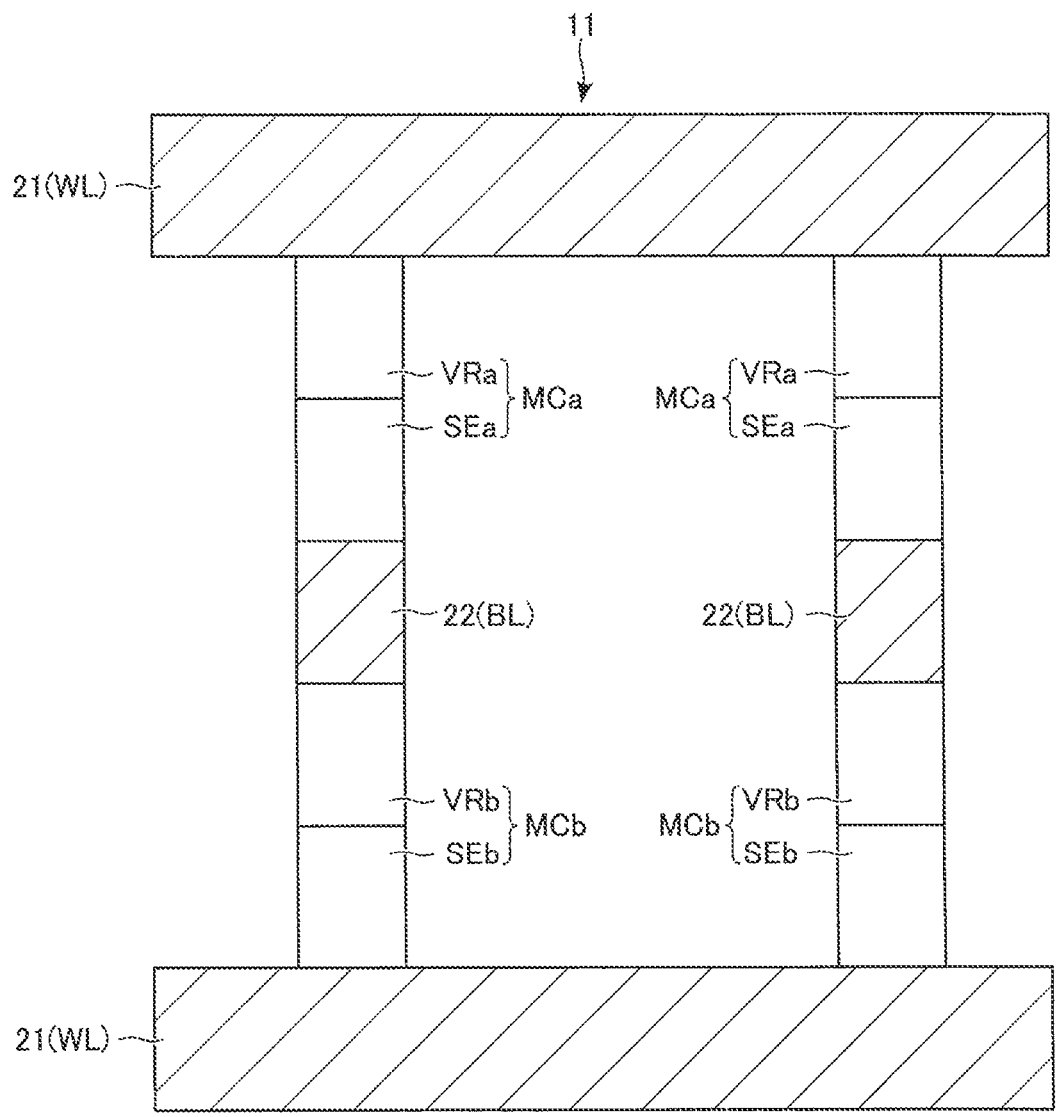
FIG. 4 shows a cross-sectional structure of part of the memory cell array of the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis and are aligned along the x-axis.

Each conductor 21 functions as a word line WL. Each conductor 21 is coupled, at its top surface, to the bottom surfaces of memory cells MCb. Each memory cell MCb has, for example, a circular shape in the xy-plane. The memory cells MCb are aligned along the y-axis on each conductor 21, and this arrangement provides a matrix of memory cells MCb over the xy-plane. Each memory cell MCb includes a structure that functions as a selector SEb and a structure that functions as a magnetoresistance effect element VRb. The structure that functions as a selector SEb and the structure that functions as a magnetoresistance effect element VRb each have one or more layers, as will be described later.

Conductors 22 are provided above the memory cells MCb. The conductors 22 extend along the x-axis and are aligned along the y-axis. Each conductor 22 is coupled, at its bottom surface, to the top surfaces of memory cells MCb aligned along the x-axis. Each conductor 22 functions as a bit line BL.

Each conductor 22 is coupled, at its top surface, to the bottom surfaces of memory cells MCa. Each memory cell MCa has, for example, a circular shape in the xy-plane. The memory cells MCa are aligned along the x-axis on each conductor 22, and this arrangement provides a matrix of memory cells MCa over the xy-plane. Each memory cell MCa includes a structure that functions as a selector SEa and a structure that functions as a magnetoresistance effect element VRa. The structure that functions as a selector SEa and the structure that functions as a magnetoresistance effect element VRa each have one or more layers, as will be described later.

A further conductor 21 is provided on the top surfaces of memory cells MCa aligned along the y-axis.

1.1.4. Structure of Memory Cell

Figure 5:
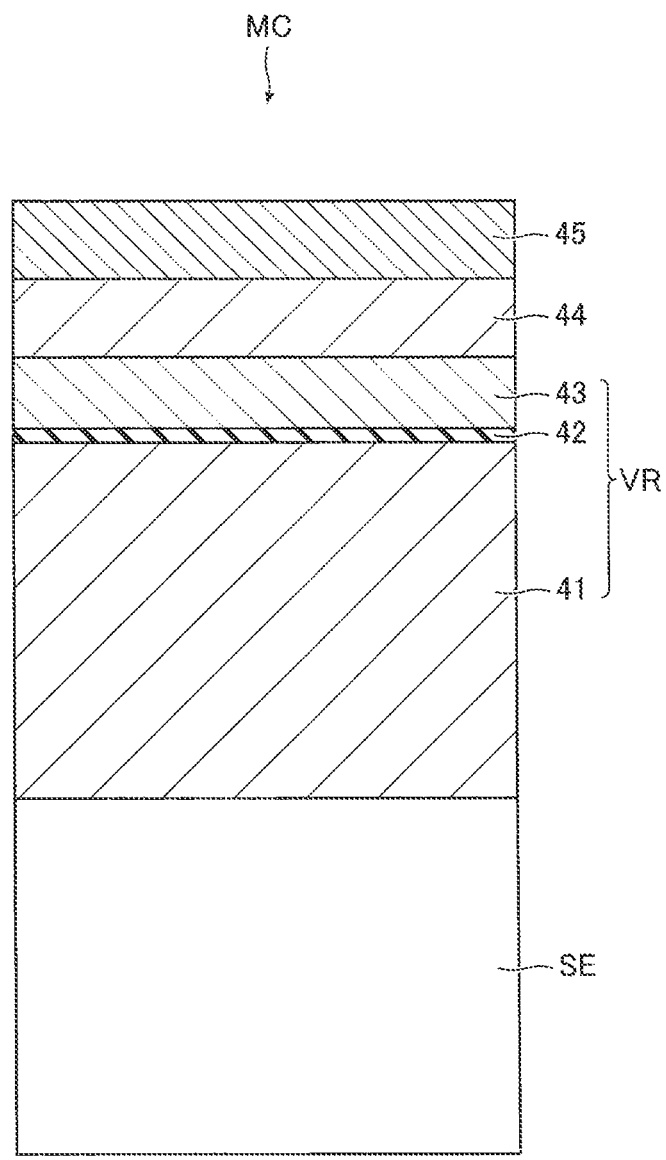
FIG. 5 shows a cross section of an example of the structure of a memory cell of the first embodiment.

FIG. 5 shows a cross section of an example of the structure of a memory cell MC according to the first embodiment. As shown in FIG. 5, the memory cell MC includes a selector SE and a magnetoresistance effect element VR.

The selector SE includes a variable resistance material. The selector SE may further include a lower electrode and an upper part electrode. In this case, the variable resistance material is located on the top surface of the lower electrode, and the upper electrode is located on the top surface of the variable resistance material. The selector SE is, for example, a switching element between two terminals, the first of the two terminals corresponding to one of the top surface and bottom surface of the selector SE, the second of the two terminals corresponding to the other one of the top surface and bottom surface of the selector SE.

The magnetoresistance effect element VR is located on the top surface of the selector SE. The magnetoresistance effect element VR exhibits a tunnel magnetoresistance effect, and includes a magnetic tunnel junction (MTJ). The following description and figures are based on the example where the magnetoresistance effect element VR is an MTJ element that includes an MTJ. Specifically, the magnetoresistance effect element VR includes a ferromagnetic layer 41, an insulating layer 42, and a ferromagnetic layer 43. As an example, the insulating layer 42 is located on the top surface of the ferromagnetic layer 41, and the ferromagnetic layer 43 is located on the top surface of the insulating layer 42.

The ferromagnetic layer 41 has an easy magnetization axis in a direction penetrating the interfaces between the ferromagnetic layer 41, the insulating layer 42, and the ferromagnetic layer 43. The easy magnetization axis of the ferromagnetic layer 41 has an angle of, for example, 45° to 90° with respect to the interfaces, and is perpendicular to, for example, the interfaces between the ferromagnetic layer 41, the insulating layer 42, and the ferromagnetic layer 43. The direction of magnetization of ferromagnetic layer 41 is intended to remain unchanged even when data is read or written from or into the memory cells MC in the magnetoresistance memory device 1. The ferromagnetic layer 41 can function as a so-called reference layer. The ferromagnetic layer 41 contains, for example, at least one of iron (Fe), cobalt (Co), or nickel (Ni). The ferromagnetic layer 41 may further contain boron (B). More specifically, the ferromagnetic layer 41 contains, for example, a cobalt iron boron (CoFeB) or an iron boride (FeB).

The ferromagnetic layer 41 may include a plurality of layers. The ferromagnetic layer 41 may have a synthetic anti-ferromagnetic (SAF) structure. In this case, the ferromagnetic layer 41 includes two ferromagnets (or, ferromagnetic layers) and a conductor (or, conductive layer) between the two ferromagnets. The conductor causes antiferromagnetic exchange coupling between the two ferromagnets.

The insulating layer 42 contains or is made of, for example, magnesium oxide (MgO), and functions as a so-called tunnel barrier.

The ferromagnetic layer 43 contains a material showing ferromagnetic properties, and contains at least iron. Therefore, the ferromagnetic layer 43 has magnetization. For example, the ferromagnetic layer 43 contains cobalt iron boron or iron boride, or is substantially formed of cobalt iron boron or iron boride. Herein and in the accompanying claims, the expression "substantially formed (or, made)" including the term "substantially" and similar expressions mean that a constituent that is "substantially formed" of something is allowed to contain unintended impurities. Examples of the unintended impurities include atoms of elements contained in a gas used during the manufacturing process of the magnetoresistance memory device 1, and atoms of elements diffused from the surroundings of other constituents that are "substantially formed" of something to the constituent that is "substantially formed" of something.

The ferromagnetic layer 43 has an easy magnetization axis in a direction penetrating the interfaces between the ferromagnetic layer 41, the insulating layer 42, and the ferromagnetic layer 43. The easy magnetization axis of the ferromagnetic layer 43 has an angle of, for example, 45° to 90° with respect to the interfaces, and is perpendicular to, for example, the interfaces between the ferromagnetic layer 41, the insulating layer 42, and the ferromagnetic layer 43. The magnetization direction of ferromagnetic layer 43 can be changed by data writing into the memory cells MC, and the ferromagnetic layer 43 can function as a so-called "storage layer".

When the magnetization direction of the ferromagnetic layer 43 is parallel to the magnetization direction of the ferromagnetic layer 41, the magnetoresistance effect element VR has a low resistance. When the magnetization direction of the ferromagnetic layer 43 is anti-parallel to the magnetization direction of the ferromagnetic layer 41, the magnetoresistance effect element VR has a resistance higher than the resistance when the magnetization direction of the ferromagnetic layer 41 and the magnetization direction of the ferromagnetic layer 43 are parallel.

When a certain magnitude of write current flows from the ferromagnetic layer 43 to the ferromagnetic layer 41, the magnetization direction of ferromagnetic layer 43 becomes parallel to the magnetization direction of ferromagnetic layer 41. In contrast, when another magnitude or write current flows from the ferromagnetic layer 41 to the ferromagnetic layer 43, the magnetization direction of ferromagnetic layer 43 becomes anti-parallel to the magnetization direction of ferromagnetic layer 41.

The memory cell MC further includes a ferromagnetic layer 44 and a ferromagnetic layer 45. The ferromagnetic layer 44 is located above the ferromagnetic layer 43, for example on the top surface of the ferromagnetic layer 43. The ferromagnetic layer 44 contains a material showing ferromagnetic properties, and contains at least iron. Therefore, the ferromagnetic layer 44 has magnetization. The ferromagnetic layer 44 has an easy magnetization axis in a direction penetrating the interfaces between the ferromagnetic layer 41, the insulating layer 42, and the ferromagnetic layer 43. The magnetization direction of the ferromagnetic layer 44 follows the magnetization direction of the ferromagnetic layer 43. Specifically, the magnetization of the ferromagnetic layer 44 has a direction parallel to the magnetization direction of the ferromagnetic layer 43. In this manner, the ferromagnetic layer 44 not only has magnetization but also has magnetization of a direction parallel to the magnetization direction of the ferromagnetic layer 43, and is therefore able to function as a storage layer together with the ferromagnetic layer 43. The ferromagnetic layer 44 further contains an oxide of an alloy containing iron. The ferromagnetic layer 44 will be further detailed later.

The ferromagnetic layer 45 is located above the ferromagnetic layer 44, for example on the top surface of the ferromagnetic layer 44. The ferromagnetic layer 45 contains a material showing ferromagnetic properties, and contains at least iron. Therefore, the ferromagnetic layer 45 has magnetization. The ferromagnetic layer 45 has an easy magnetization axis in a direction penetrating the interfaces between the ferromagnetic layer 41, the insulating layer 42, and the ferromagnetic layer 43. The magnetization direction of the ferromagnetic layer 45 follows the magnetization direction of the ferromagnetic layer 44, and thus follows the magnetization direction of the ferromagnetic layer 43. Specifically, the magnetization of the ferromagnetic layer 45 has a direction parallel to the magnetization directions of the ferromagnetic layer 43 and the ferromagnetic layer 44. In this manner, the ferromagnetic layer 45 not only has magnetization but also has magnetization of a direction parallel to the magnetization directions of the ferromagnetic layer 43 and the ferromagnetic layer 44, and is therefore able to function as a storage layer together with the ferromagnetic layer 43 and the ferromagnetic layer 44. The ferromagnetic layer 45 will be further detailed later.

1.1.5. Details of Ferromagnetic Layer 45

The ferromagnetic layer 45 contains iron as described above; more specifically, the ferromagnetic layer 45 either contains or is substantially formed of an alloy of iron and a 5d transition element. The 5d transition element is also referred to as a 5d transition metal, and refers to a transition metal in which the 5d electron configuration (also referred to as "5d orbital") is filled with one or more and less than 10 electrons. Specifically, the 5d transition metal includes lutetium (Lu), hafnium (Hf), tantalum (Ta), tungsten (W), rhenium (Re), osmium (Os), iridium (Ir), and platinum (Pt). Thus, specifically, the ferromagnetic layer 45 contains or is substantially formed of an alloy of iron and at least one of lutetium, hafnium, tantalum, tungsten, rhenium, osmium, iridium, or platinum.

Figure 6:
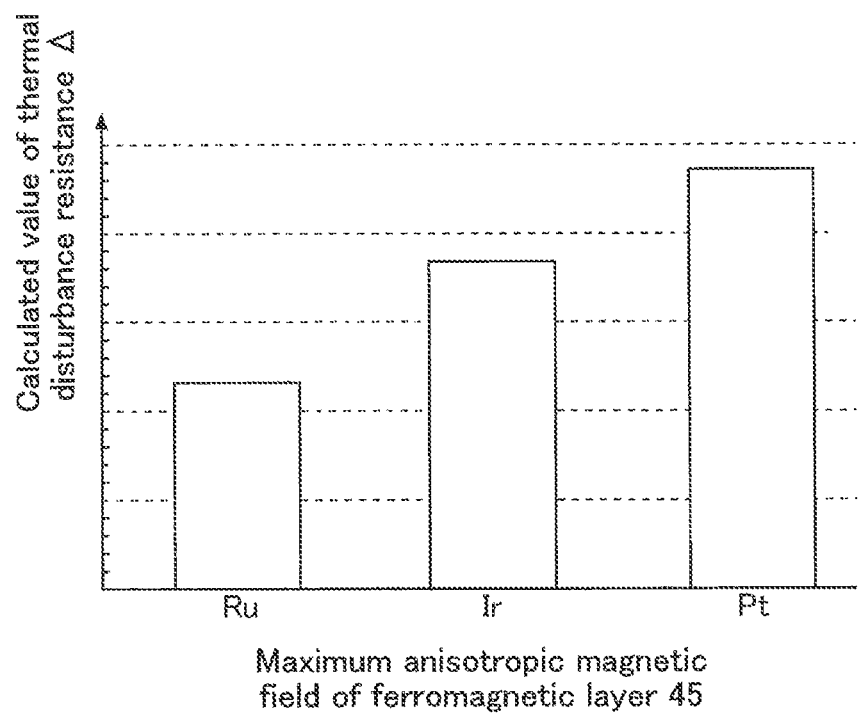
FIG. 6 shows a relationship between a maximum anisotropic magnetic field of respective ferromagnets containing some different metals under a certain condition, and a calculated thermal disturbance resistance.

The inventors have found that a ferromagnet containing a 5d transition metal has an anisotropic magnetic field higher than that of a ferromagnet not containing a 5d transition metal. The anisotropic magnetic field correlates with a resistance to thermal disturbance (hereinafter referred to as a "thermal disturbance resistance") of the magnetization of the ferromagnet having the anisotropic magnetic field. FIG. 6 shows a relationship between a maximum anisotropic magnetic field of respective ferromagnets containing some different metals under a certain condition, and a calculated thermal disturbance resistance Δ. FIG. 6 shows platinum and iridium as examples of the 5d transition metal. FIG. 6 also shows Ru, which is not a 5d transition metal, for the purpose of comparison.

As shown in FIG. 6, the thermal disturbance resistance Δ of a ferromagnet containing iridium is higher than the thermal disturbance resistance Δ of a ferromagnet containing Ru. The thermal disturbance resistance Δ of a ferromagnet containing platinum is higher than the thermal disturbance resistance Δ of a ferromagnet containing Ru, and also higher than the thermal disturbance resistance Δ of a ferromagnet containing iridium. The reason why the thermal disturbance resistance Δ of a ferromagnet containing a 5d transition metal is higher than the thermal disturbance resistance Δ of a ferromagnet containing other elements is considered to be related to the spin-orbit interaction of 5d transition metals, and is considered to be that 5d transition metals have a large spin-orbit interaction. The spin-orbit interaction helps maintain the spin of electrons in a ferromagnet and accordingly maintain the magnetization. Thus, it is considered that 5d transition metal atoms increase the thermal disturbance resistance of a ferromagnet containing a 5d transition metal. It is considered that the larger the spin-orbit interaction by a 5d transition metal contained in a ferromagnet, the higher the thermal disturbance resistance of the ferromagnet.

In general, it is considered that the larger the mass number (or, atomic number) of an atom, the larger the spin-orbit interaction by the atom. Lutetium, hafnium, tantalum, tungsten, rhenium, osmium, iridium, and platinum have a larger mass number in the mentioned order. Therefore, the ferromagnetic layer 45 can contain a 5d transition metal having a larger mass number. For example, the ferromagnetic layer 45 can contain or be substantially formed of an iron-platinum (FePt) alloy, an iron-iridium (FeIr) alloy, or an iron-platinum-iridium (FePtIr) alloy.

1.1.6. Details of Ferromagnetic Layer 44

The ferromagnetic layer 44 contains iron as described above, more specifically contains or is substantially formed of an oxide of an alloy containing iron. More specifically, the ferromagnetic layer 44 contains or is substantially formed of an oxide of an alloy of iron and at least one of rhodium, titanium, zirconium, cobalt, boron, vanadium, niobium, chromium, molybdenum, silicon, scandium, yttrium, gadolinium, magnesium (Mg), or aluminum (Al).

The ferromagnetic layer 44 is intended to fulfill two functions. The first function is to absorb boron in the ferromagnetic layer 43. The second function is to suppress diffusion of the 5d transition metal in the ferromagnetic layer 45 into the ferromagnetic layer 43.

Boron in the ferromagnetic layer 43 is useful when the ferromagnetic layer 43 is formed. On the other hand, boron may unintentionally suppress the thermal disturbance resistance D of the ferromagnetic layer 43. Therefore, the amount of boron in the ferromagnetic layer 43 is desirably small in the magnetoresistance memory device 1. The ferromagnetic layer 44 contributes to suppression of the amount of boron in the ferromagnetic layer 43.

In the ferromagnetic layer 45, 5d transition metals help improve the thermal disturbance resistance Δ of the ferromagnetic layer 45. On the other hand, the amount of 5d transition metal is desirably small in the ferromagnetic layer 43. This is because the 5d transition metal in the ferromagnetic layer 43 increases the damping constant of the ferromagnetic layer 43. The ferromagnetic layer 43 is in contact with the insulating layer 42, thus having a great influence on the ease of writing data to the memory cell MC, that is, having a great influence on determination of the magnitude of a necessary write current. This is because the electrons flowing out of the insulating layer 42 during writing data reach the ferromagnetic layer 43 first. The strong spin-orbit interaction of 5d transition metals leads to stability of the magnetization of a ferromagnetic layer containing a 5d transition metal, and at the same time leads to difficulty in switching of the magnetization of the ferromagnetic layer. Therefore, the more 5d transition metals the ferromagnetic layer 43 contains, the higher a damping constant the ferromagnetic layer 43 has. The high damping constant of the ferromagnetic layer 43 makes it difficult to switch the magnetization of the ferromagnetic layer 43. Therefore, the smaller the damping constant of the ferromagnetic layer 43, the smaller the write current for writing data to the memory cell MC including the ferromagnetic layer 43. Based on this, the ferromagnetic layer 44 is required to suppress diffusion of the 5d transition metal atoms in the ferromagnetic layer 45 into the ferromagnetic layer 43. To this end, the ferromagnetic layer 44 either contains or is substantially formed of an oxide. Since the atoms of an oxide have a strong binding energy with respect to each other, the atoms diffused into the oxide can be confined in the oxide.

The smaller the atomic number of the atoms in the ferromagnetic layer 44, the higher the capability of the ferromagnetic layer 44 of confining 5d transition metal atoms in the ferromagnetic layer 44. This is because atoms with a smaller atomic number have a smaller distance from surrounding atoms. In addition, atoms with a certain atomic number are less likely to diffuse in a material formed of atoms with an atomic number smaller than the atomic number of these atoms. Therefore, the ferromagnetic layer 44 can either contain or be substantially formed of an oxide of an alloy of iron and atoms having an atomic number smaller than the atomic number of the 5d transition metal contained in the ferromagnetic layer 45.

1.1.7. Advantages (Effects)

According to the first embodiment, it is possible to provide a magnetoresistance memory device including a memory cell which has a high resistance to the thermal disturbance of stored data and in which an increase in the write current is suppressed, as will be described below.

The memory cell MC includes the ferromagnetic layer 44 above the ferromagnetic layer 43, and the ferromagnetic layer 45 above the ferromagnetic layer 44. The ferromagnetic layer 45 contains a 5d transition metal. The 5d transition metal imparts a higher thermal disturbance resistance to the magnetization of a ferromagnet containing the 5d transition metal than that of a ferromagnet not containing a 5d transition metal. The ferromagnetic layer 45 has magnetization, which follows (or, is parallel to) the magnetization of the ferromagnetic layer 43. Due to the high thermal disturbance resistance of the magnetization of the ferromagnetic layer 45, the ferromagnetic layer 44 has a high thermal disturbance resistance; and due to the high thermal disturbance resistance of the magnetization of the ferromagnetic layer 44, the ferromagnetic layer 43 has a high thermal disturbance resistance. Thus, the magnetization of the storage layer including the ferromagnetic layers 43, 44, and 45 has a high thermal disturbance resistance. Because of this, the thermal disturbance resistance of the magnetization of the storage layer including the ferromagnetic layer 45 is higher than the thermal disturbance resistance of the magnetization of the storage layer not containing a 5d transition metal. Accordingly, a memory cell MC including a storage layer having a high thermal disturbance resistance of the magnetization can be achieved.

Figure 7:
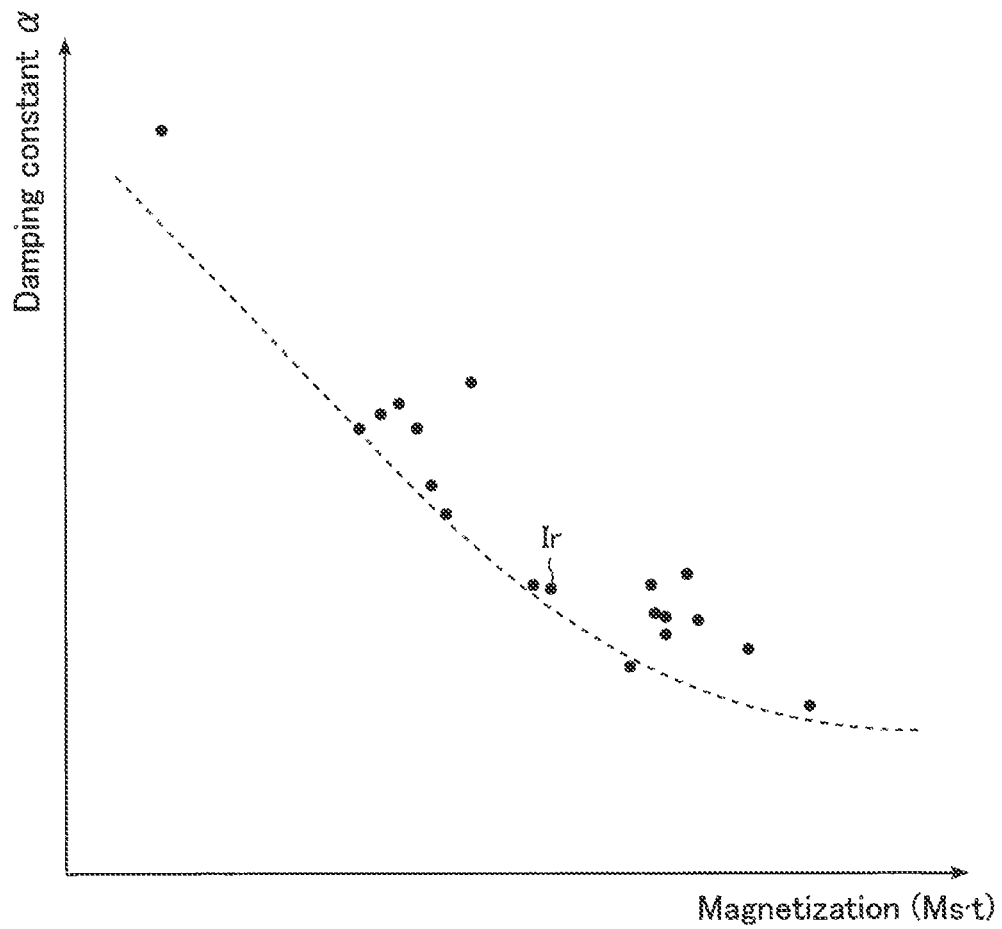
FIG. 7 shows a relationship between magnetization and a damping constant of a ferromagnetic layer 43.

On the other hand, 5d transition metals make the damping constant of a ferromagnet containing a 5d transition metal higher than the damping constant of a ferromagnet not containing a 5d transition metal. When the damping constant of the ferromagnetic layer 43 that has the largest influence on the ease of switching of the resistance state of the memory cell MC by the write current because of the contact with the insulating layer 42, among the ferromagnetic layers 43, 44, and 45 functioning as storage layers, is high, a necessary write current to the memory cell MC is high. In the first embodiment, when the ferromagnetic layer 44 contains an oxide, 5d transition metal atoms remain in the ferromagnetic layer 44 and diffusion of the 5d transition metal atoms to the ferromagnetic layer 43 is suppressed. Therefore, the presence of the ferromagnetic layer 45 suppresses an increase in the damping constant of the ferromagnetic layer 43 caused by diffusion of the 5d transition metal atoms in the ferromagnetic layer 45 into the ferromagnetic layer 43. Accordingly, the write current of the memory cell MC being higher due to the presence of the ferromagnetic layer 45 than in the case without the ferromagnetic layer 45 is suppressed. FIG. 7 shows this phenomenon.

FIG. 7 shows a relationship between the magnetization (Ms·t) and the damping constant of the ferromagnetic layer 43 of the memory cell MC. FIG. 7 shows the case where the ferromagnetic layer 45 contains iridium and the case where the ferromagnetic layer 45 contains other elements under a certain condition that includes the thickness of the ferromagnetic layer 43. The dots other than that with a reference symbol "Ir" show materials other than 5d transition metals. The broken line indicates the relationship between the magnetization and a damping constant α obtained by fitting of a value of the materials other than iridium. The materials close to the broken line are suitable for use as materials of the ferromagnetic layer 45. As is apparent from FIG. 7, even in the case where iridium is used, properties close to the broken line are shown, and the use of iridium suppresses an increase in the damping constant α, as in the case where other materials are used. This results from the ferromagnetic layer 44 suppressing diffusion of iridium, as described above.

By diffusing into the insulating layer 42, the 5d transition metal atoms can also decrease the properties of the insulating layer 42, and accordingly an MR ratio of the memory cell MC (i.e., a ratio between the maximum resistance value and the minimum resistance value of the memory cell MC). In contrast, since the ferromagnetic layer 44 suppresses diffusion of the 5d transition metal atoms beyond the ferromagnetic layer 44, diffusion of the 5d transition metal atoms to the insulating layer 42 is also suppressed to a large extent or is prevented. Thus, degradation of the properties of the memory cell MC due to the presence of the ferromagnetic layer 45 as compared to the case without the ferromagnetic layer 45 is suppressed.

From the foregoing, the cooperation of the ferromagnetic layers 43, 44, and 45 makes it possible to provide a storage layer which has a high resistance to the thermal disturbance of data and in which an increase in the write current is suppressed.

1.2. Modification

Figure 8:
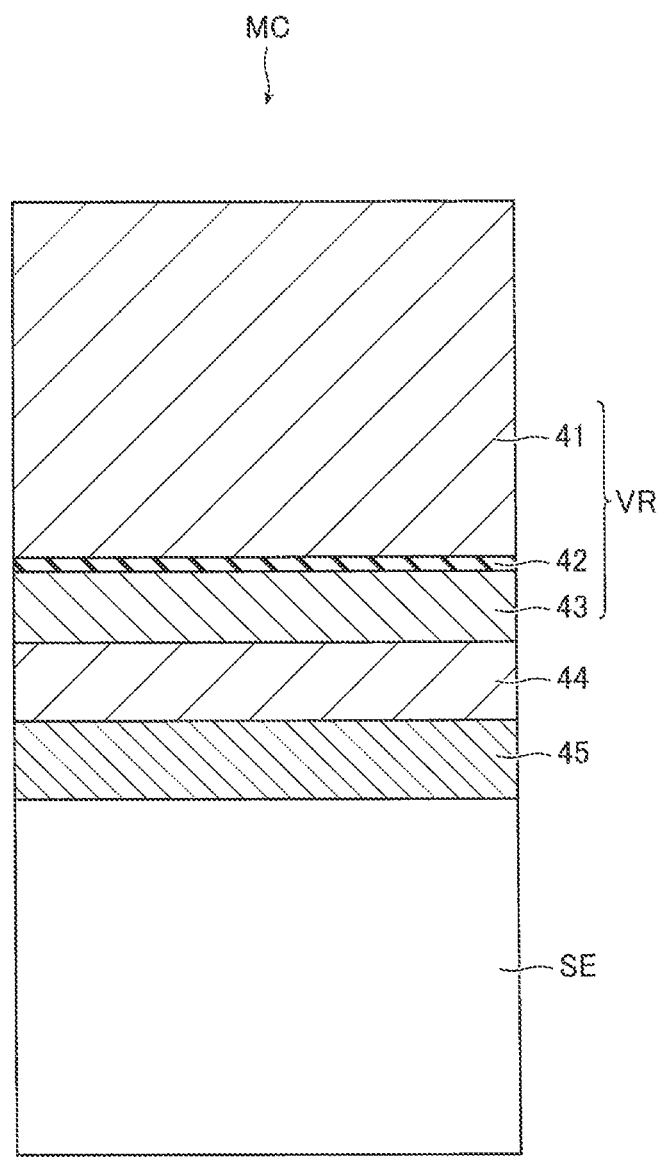
FIG. 8 shows a cross section of an example of the structure of a memory cell of a modification of the first embodiment.

The foregoing descriptions relate to the example in which the ferromagnetic layer 41, the insulating layer 42, the ferromagnetic layer 43, the ferromagnetic layer 44, and the ferromagnetic layer 45 are stacked in the mentioned order. However, the first embodiment is not limited to this example. The order in which the ferromagnetic layer 41, the insulating layer 42, the ferromagnetic layer 43, the ferromagnetic layer 44, and the ferromagnetic layer 45 are arranged may be opposite to that shown in FIG. 5. That is, the ferromagnetic layer 45, the ferromagnetic layer 44, the ferromagnetic layer 43, the insulating layer 42, and the ferromagnetic layer 41 may be stacked in the mentioned order in a direction away from the selector SE, as shown in FIG. 8.

In addition, the foregoing descriptions relate to the example in which the memory cell MC includes the selector SE. However, the first embodiment is not limited to this example. For example, the memory cell MC includes a magnetoresistance effect element VR and a transistor. The magnetoresistance effect element VR and the transistor are coupled in series. When the transistor is turned on by the application of a voltage to the gate electrode of the transistor, the magnetoresistance effect element VR coupled to this transistor is selected. In this example, the top surface of the ferromagnetic layer 41 is coupled to an impurity diffusion layer via a conductor in place of the selector SE in the structure shown in FIG. 5. The impurity diffusion layer functions as a source/drain of the transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistance memory device, comprising:
 a memory cell including:
  a first ferromagnetic layer, a direction of magnetization of the first ferromagnetic layer remaining unchanged when data is read or written from or into the memory cell;
  a tunnel barrier layer above the first ferromagnetic layer;
  a second ferromagnetic layer above the tunnel barrier layer;
  a third ferromagnetic layer above the second ferromagnetic layer, the third ferromagnetic layer including an oxide of an alloy including iron; and
  a fourth ferromagnetic layer above the third ferromagnetic layer, the fourth ferromagnetic layer including iron and a 5d transition metal, and a direction of magnetization of the fourth ferromagnetic layer being changeable by writing data into the memory cell.

2. The device according to claim 1, wherein the 5d transition metal includes at least one of lutetium, hafnium, tantalum, tungsten, rhenium, osmium, iridium, or platinum.

3. The device according to claim 2, wherein the alloy is an alloy of iron and a metal having an atomic number smaller than an atomic number of the 5d transition metal.

4. The device according to claim 3, wherein the third ferromagnetic layer is on the second ferromagnetic layer, and the fourth ferromagnetic layer is on the third ferromagnetic layer.

5. The device according to claim 4, wherein the second ferromagnetic layer includes iron and boron.

6. The device according to claim 5, wherein the metal is at least one of rhodium, titanium, zirconium, cobalt, boron, vanadium, niobium, chromium, molybdenum, silicon, scandium, yttrium, gadolinium, magnesium, or aluminum.

7. The device according to claim 1, wherein the 5d transition metal includes at least one of iridium or platinum.

8. The device according to claim 7, wherein the alloy is an alloy of iron and a metal having an atomic number smaller than an atomic number of the 5d transition metal.

9. The device according to claim 8, wherein the third ferromagnetic layer is on the second ferromagnetic layer, and the fourth ferromagnetic layer is on the third ferromagnetic layer.

10. The device according to claim 9, wherein the second ferromagnetic layer includes iron and boron.

11. The device according to claim 10, wherein the metal is at least one of rhodium, titanium, zirconium, cobalt, boron, vanadium, niobium, chromium, molybdenum, silicon, scandium, yttrium, gadolinium, magnesium, or aluminum.

12. The device according to claim 7, wherein the third ferromagnetic layer is on the second ferromagnetic layer, and the fourth ferromagnetic layer is on the third ferromagnetic layer.

13. The device according to claim 1, wherein the alloy is an alloy of iron and a metal having an atomic number smaller than an atomic number of the 5d transition metal.

14. The device according to claim 13, wherein the third ferromagnetic layer is on the second ferromagnetic layer, and the fourth ferromagnetic layer is on the third ferromagnetic layer.

15. The device according to claim 14, wherein the second ferromagnetic layer includes iron and boron.

16. The device according to claim 15, wherein the metal is at least one of rhodium, titanium, zirconium, cobalt, boron, vanadium, niobium, chromium, molybdenum, silicon, scandium, yttrium, gadolinium, magnesium, or aluminum.

17. The device according to claim 1, wherein the third ferromagnetic layer is on the second ferromagnetic layer, and the fourth ferromagnetic layer is on the third ferromagnetic layer.

18. The device according to claim 17, wherein the second ferromagnetic layer includes iron and boron.

19. The device according to claim 1, wherein the second ferromagnetic layer includes iron and boron.

20. The device according to claim 1, wherein the alloy is an alloy of iron and at least one of rhodium, titanium, zirconium, cobalt, boron, vanadium, niobium, chromium, molybdenum, silicon, scandium, yttrium, gadolinium, magnesium, or aluminum.

* * * * *